United States Patent
Langer et al.

(10) Patent No.: US 6,936,963 B2
(45) Date of Patent: Aug. 30, 2005

(54) PROCESS FOR ENCAPSULATING A COMPONENT MADE OF ORGANIC SEMICONDUCTORS

(75) Inventors: Alfred Langer, Kissing (DE); Ekkehard Messner, Augsburg (DE)

(73) Assignee: Patent-Treuhand-Gesellschaft fur elektrische Gluhlampen mbH, Munich (DE)

( * ) Notice: Subject to any disclaimer, the term of this patent is extended or adjusted under 35 U.S.C. 154(b) by 84 days.

(21) Appl. No.: 10/429,057

(22) Filed: May 2, 2003

(65) Prior Publication Data

US 2003/0222061 A1 Dec. 4, 2003

(30) Foreign Application Priority Data

May 3, 2002 (DE) .......................................... 102 19 951

(51) Int. Cl.⁷ .................. H05B 33/04; B23K 1/005; B23K 26/20
(52) U.S. Cl. ................ 313/509; 219/85.13; 219/121.64
(58) Field of Search ........................ 219/121.64, 121.66, 219/85.13; 313/509

(56) References Cited

U.S. PATENT DOCUMENTS

| | | | | |
|---|---|---|---|---|
| 4,346,963 A | * | 8/1982 | Kobale et al. | 349/122 |
| 4,354,717 A | * | 10/1982 | Rech et al. | 445/28 |
| 4,883,777 A | * | 11/1989 | Yamanaka | 501/15 |
| 6,111,357 A | * | 8/2000 | Fleming et al. | 313/509 |
| 6,160,346 A | | 12/2000 | Vleggaar et al. | |
| 6,195,142 B1 | | 2/2001 | Gyotoku et al. | |

FOREIGN PATENT DOCUMENTS

| | | | | |
|---|---|---|---|---|
| DE | 2926331 A1 | * | 1/1981 | |
| DE | 38 37 300 A1 | | 5/1990 | |
| DE | 197 27 913 A1 | | 1/1999 | |
| DE | 198 33 252 A1 | | 2/2000 | |
| DE | 198 45 075 A1 | | 4/2000 | |
| DE | 198 57 550 A1 | | 6/2000 | |
| DE | 100 05 296 A1 | | 8/2001 | |
| DE | 10027989 A1 | * | 12/2001 | |
| GB | 1209869 A | * | 10/1970 | ............ C03C/3/12 |
| JP | 60-234768 A | * | 11/1985 | |
| JP | 4-214045 A | * | 8/1992 | |
| JP | 2001-319775 A | * | 11/2001 | |
| WO | WO 98/53644 A1 | | 11/1998 | |
| WO | WO 00/12256 A1 | | 3/2000 | |
| WO | WO 01/18886 A2 | | 3/2001 | |
| WO | WO 01/18887 A1 | | 3/2001 | |

* cited by examiner

Primary Examiner—Geoffrey S. Evans
(74) Attorney, Agent, or Firm—Frishauf, Holtz, Goodman & Chick, P.C.

(57) ABSTRACT

A process for encapsulating a component made of organic semiconductors is provided which includes steps of: a) providing a housing including a substrate with electrical connections and a cover; b) mixing a soldering glass with at least one of a binder and a solvent; c) applying the soldering glass at least to the cover, in the form of an encircling bank; d) expelling the binder or solvent; e) sintering-on of the solder; f) covering the substrate with layers which represent the semiconductor component together with electrodes; g) placing the cover onto the substrate; and h) locally heating the soldering glass by means of a light source with a predetermined peak wavelength, wherein the housing parts and soldering glass are matched to one another such that their coefficients of thermal expansion differ from one another by less than $1.0 \times 10^{-6} K^{-1}$.

15 Claims, 1 Drawing Sheet

PROCESS FOR ENCAPSULATING A COMPONENT MADE OF ORGANIC SEMICONDUCTORS

FIELD OF THE INVENTION

The invention relates to a process for encapsulating a component made of organic semiconductors such as OLEDs, i.e. organic light-emitting devices based on electroluminescence.

BACKGROUND ART

WO 01/18 887 has already disclosed a process for encapsulating a component made of organic semiconductors, comprising a transparent substrate, an electrode which has been applied to it, luminescent layers of different colors and a counterelectrode. The semiconductor component is encapsulated in an airtight manner by means of a housing which is joined to the substrate by adhesive.

The adhesive used is an UV-curable reaction adhesive based on epoxy resin. However, organic adhesives of this nature do not achieve a satisfactory seal with respect to oxygen and moisture, which leads to premature failure of the OLEDs.

OBJECTS OF THE INVENTION

It is an object of the invention to provide a process for encapsulating a component made of organic semiconductors with a good seal. And it is also an object of the present invention to provide an encapsulated semiconductor component which has a good seal and a long life time.

BRIEF DESCRIPTION OF THE DRAWINGS

The invention will be explained in more detail below with reference to the drawings, wherein.

DETAILED DESCRIPTION

Figure 1:
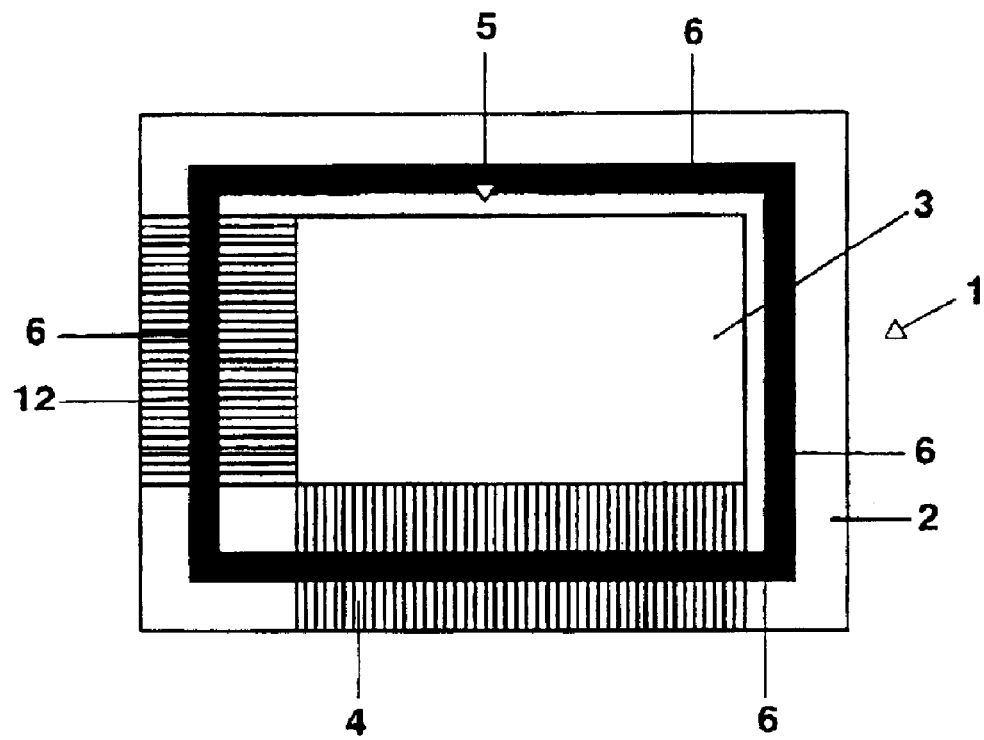
FIG. 1 shows an OLED array according to one exemplary embodiment as seen from above.

Organic LEDs (OLEDS), and in particular displays composed of organic LEDs, comprise a layer assembly of organic layers (the actual OLED) and metallic layers for contact-making (electrodes) which are positioned between two thin sheets of glass (e.g. 0.5 to 1.0 mm thick). These form the base (substrate) and the cover of a housing. Furthermore, if appropriate, the housing may also have side walls. Without encapsulation, these layers would be attacked by oxygen and water vapor, leading to the failure of the OLED.

An encapsulation process for the OLED which permanently mechanically joins the remaining parts of the housing to the substrate and surrounds the OLED in a gas-tight manner, thus protecting it from attack by oxygen and moisture, has been developed. The OLED must not be damaged by excessive thermal loading during the closure operation.

A method for mechanically stably joining the substrate and remaining housing parts made from glass, between which the OLED is situated, with the aid of a soldering glass which melts at relatively low temperature, namely at approximately 400 to 600° C., and for enclosing the OLEO in a gas-tight manner has been developed.

In the method which has been developed, the procedure is as follows:

Firstly, a suitable soldering glass is selected. Soldering glasses in which the coefficient of thermal expansion is close to or slightly below that of the glass to be soldered are suitable. The soldering glass should in particular have a coefficient of thermal expansion which is at most $1.0 \times 10^{-6} K^{-1}$ lower, preferably 0.1 to $0.4 \times 10^{-6} K^{-1}$ lower. In this context, a typical absolute value for the coefficient of thermal expansion of the soldering glass is approximately $7.0 \times 10^{-6} K^{-1}$. Moreover, it must be possible to work the solder at a temperature at which the glass which is to be soldered has not yet softened. A soldering glass working point which is 100 to 200 K lower than the softening point of the glass which is to be soldered is particularly suitable. If an organic binder or solder is used to apply the solder, the solder must only soften and close up pores at a temperature at which the binder has already been expelled. Suitable soldering glasses include lead, borate and phosphate glasses, in which the absorption properties with respect to the introduction of heating radiation, which in particular lies in the infrared region at approximately 780 to 1100 nm, can advantageously be improved by the addition of absorbent additives, such as FeO. The background behind this is that the soldering glass is then set optimally to be softened or liquefied by absorption of suitable laser radiation (or other radiation or light emission).

In a second step, the solder is applied to the substrate. There are a number of suitable processes for doing this:

a) The soldering glass may be linearly applied to the inner side of the cover, i.e. the upper glass pane. In this case, the solder, e.g. CERDEC 10104 produced by CERDEC AG, may be in the form of a paste or suspension. A solder which melts at as low a temperature as possible must be used in order not to cause thermal damage to the OLED during the soldering operation. The application can be effected with the aid of a method which allows uniform application of the solder, in particular by means of a dispenser or by screen printing. This may be followed by drying or cooling of the applied solder in order to improve handling of the cover.

The next step is for the organic binder (e.g. ELVACITE 2045 produced by ICI ACRYLICS) or the solvent to be expelled from the soldering glass. The expulsion is effected by removing it by heating in a suitable (generally oxidizing) atmosphere. Soldering glass and binder must be matched to one another in such a way that the binder can be expelled at a temperature at which the soldering glass has not yet softened. However, it is also conceivable to use other binder systems in which part of the binder removal is effected by dissolution. It is also possible to use a binder-free suspension in which after the application only the solvent, for example water or alcohol, has to be removed.

b) Alternatively, the process a) may be followed by an additional process step of sintering the solder onto the cover.

c) Alternatively, in addition to the processes a) and b) (i.e., application of the solder to the cover as described above) solder may be applied to the lower glass pane (the substrate) as far as possible congruently with respect to the cover, wherein before the solder paste or solder suspension is applied, the substrate has already been provided with metallic conductor tracks (e.g. copper or aluminum alloys) for making contact with the OLED or OLED array.

During the removal of binder from the solder and sintering of the solder onto the substrate, it should be ensured that an oxidizing atmosphere is not used (vacuum is preferred) and that a temperature at which the conductor tracks are damaged is not exceeded. This means that the melting point of the metals of the conductor tracks should not be exceeded; if aluminum is being used, a temperature of 600° C. is typical. The substrate must then be covered with the OLED layers after the solder has been fully sintered.

d) Alternatively, use may be made of solder strips which have been pressed to be free of binder and are put in place and positioned prior to the actual soldering operation.

e) Alternatively, use may be made of a pulverulent solder without binder. This is applied to the cover by being trickled on in metered form. To produce a "glass bead" (i.e. a bank or seam in order to achieve ease of handling), it can be melted as soon as it is trickled into place, using a strong flame or a laser. Another possibility is for the (flat) glass with the solder to be introduced into a furnace in order for the solder to be melted or for the solder to be trickled directly onto the preheated glass plate in order to melt the solder.

f) Alternatively, the process e) can be modified in such a way that the solder is also applied to the substrate. The melting in the furnace or the trickling onto the preheated plate, if appropriate under a protective atmosphere, is particularly suitable for application to the substrate, since the substrate already has on it the metallic conductor tracks which may be damaged by a flame or laser radiation. The substrate then has to be covered with the OLED layers after the solder has been fully sintered.

The next basic process step is the heating of the solder using a laser or other bundled light source (laser soldering). In this connection, it is noted that organic LEDs are only able to withstand low levels of thermal loads. Heating to over 100° C. is only permissible for a few minutes, and heating at 150° C. should not last more than 1–2 minutes. Therefore, the heating of the solder must be locally limited.

Soldering using a laser beam has the advantage that the considerable heating of the solder and of the two glass panes which is required for soldering can be limited to a restricted space, thus preventing the OLED from being damaged.

Nd-YAG lasers (emission at 1060 nm), pulsed or continuous (CW), or diode lasers (emission at 808 nm or 940 nm) are particularly suitable. The abovementioned wavelengths lie in an infrared region, in which the flat glass to be soldered is still transmitting well, so that the laser radiation can be introduced directly into the solder and consequently most of the heat is evolved in the solder.

If the seam of solder is located at the edge of the two display glass panes, the edges of the panes which are associated with one another, in particular those of the cover, can be beveled in order to create space for swelling solder.

There are a number of suitable processes for this soldering is operation:

a) After the cover has been put in place, the laser radiates through the cover, moving down the bead of solder, causing the solder to melt and thus fuse together the two panes. For this purpose, only the cover glass has to be IR-transmitting for the heating radiation, i.e. preferably in the range from 780 to 1100 nm.

b) Alternatively, the process a) can be modified in such a way that, in addition, a laser simultaneously also radiates through the substrate and heats the bead of solder from the other side. In this case, the laser has to avoid or reduce the radiation intensity at the numerous locations at which the track of the solder crosses the various conductor tracks. In this case, the substrate, like the cover, must be IR-transmitting.

c) Alternatively, the entire solder seam may be heated simultaneously by means of a suitable diode laser array. In this case, the diode laser array radiates through the cover or through the cover and the substrate. This results in simultaneous softening of the entire seam. This enables the two display panes to move uniformly closer together under the weight of the upper pane or as a result of the application of a compressive force, so that better contact can be achieved between soldering glass and the glass panes which are to be joined. And it is noted that the statements which have been made under a) and b) in connection with IR transmission apply to this option too.

d) In all the abovementioned soldering processes, a laser with a reduced output per unit area, for example, as a result of an out-of-focus setting or a reduction in the absolute power, can also be used for preheating or reheating, in order to prevent the formation of cracks resulting from the concentrated introduction of, heat or the annealable stresses which result.

e) In all the soldering processes, moreover, it is possible, by using a suitable device, to carry out the soldering under protective gas, in order to suitably protect the diode array and conductor tracks.

Figure 2:
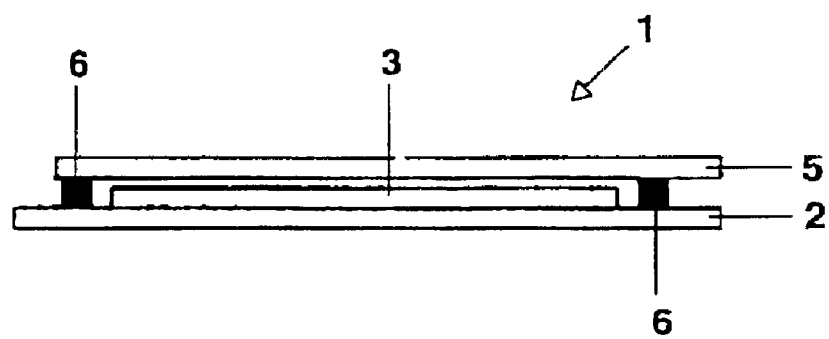
FIG. 2 shows a side view of the exemplary embodiment of FIG. 1.

FIG. 1 shows a plan view of a typical OLED, and FIG. 2 shows a side view of the OLED illustrated in FIG. 1. As shown in these drawings, the OLED 1 comprises a substrate 2, to which an OLED array of pixels 3 has been applied. This comprises, in a known way, electrodes 4, electroluminescent organic phosphors applied in layers and counterelectrodes 12. In each case the conductor track connections which lead to the outside are what can be seen of the electrodes 4 and counterelectrodes 12.

The housing is formed by a flat glass which is transparent in the visible and near IR as cover 5, the side walls 6 being made completely or partially from soldering glass. The soldering glass forms a bank, often referred to as a bead or seam. The cover 5 is a flat pane with vertical walls.

Figure 3:
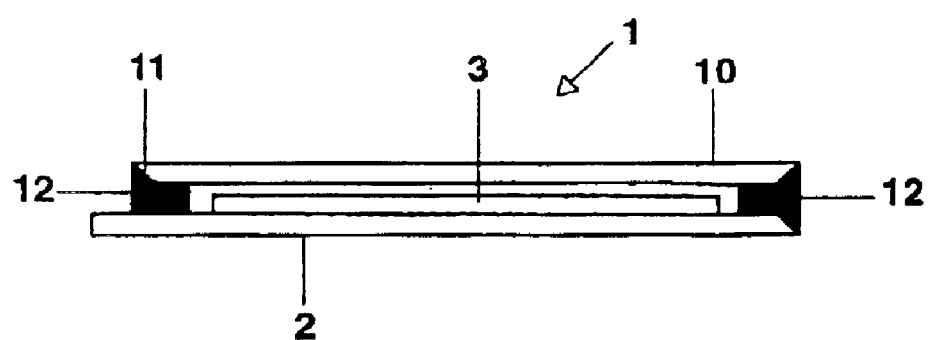
FIG. 3 shows a side view of another exemplary embodiment.

In a further preferred embodiment (FIG. 3) the cover 10 of the OLED 1 has beveled side walls 11 (known as chamfers), so that the solder 12 acting as a side wall of the housing can be applied as a particularly thick wall and the contact between solder 12 and cover 10 is improved, so that particularly reliable sealing is achieved.

The production process is carried out in such a way that the substrate and cover used are in each case a flat glass, for example, such as a SODALINE display glass produced by MERCK. The soldering glass used may be a soldering glass of suitably matched coefficient of thermal expansion produced by CERDEC AG (CERDEC 10104). If appropriate, 2% by weight of $Fe_2O_3$ can be added to this soldering glass in order to improve the IR absorption. Furthermore, a binder can be admixed to the soldering glass; an example of a suitable binder is Cerdec 80858 or ICI Elvacite 2045 . It is also noted that it is important to be able to expel the binder at below the softening point of the soldering glass (which for Cerdec 10104 is 440° C.).

Addition of 1 to 4% by weight of $Fe_2O_3$ is particularly suitable. Other suitable additives as absorbers are metal oxides which can be selected according to the desired absorption capacity.

If ELVACITE is used as the binder, the solder may be firstly heated at 400° C. and then sintered onto the substrate at 500° C. This may be followed by fusion by means of an Nd-YAG laser which can be operated in pulsed mode. The load on the material can be accurately metered by means of pulse duration and pause time.

Alternatively, if CERDEC 80858 is used as the binder, it may be removed by heating at 420° C., and the soldering glass may then be sintered to the substrate and to the cover at 520° C. Fusion can be effected by means of a continuous Nd-YAG laser.

A further alternative is to use an IR diode laser or $CO_2$ laser, as is known in other contexts (see, for example, WO 00/12256).

In another embodiment, the housing has separate side walls made from glass, and the soldering glass in each case is introduced between the side walls and the cover or substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

This application claims the priority benefit of German Application No. 10219951.5 filed May 3, 2002, the entire contents of which are incorporated herein by reference.

What is claimed is:

1. A process for encapsulating a component made of organic semiconductors, said process comprising:

providing: (i) a substrate as a housing part with electrical connections applied to it, (ii) at least one further housing part including at least a cover, and (iii) soldering glass, wherein a coefficient of thermal expansion of the substrate, a coefficient of thermal expansion of the further housing part and a coefficient of thermal expansion of the soldering glass are matched such that the respective coefficients of thermal expansion differ from one another by less than $1.0 \times 10^{-6} K^{-1}$;

applying the soldering glass at least to the cover, as an encircling bank, wherein the soldering glass is a pulverulent soldering glass which is tricked into position;

sintering-on the solder;

covering the substrate with the semiconductor component together with electrodes;

placing the cover onto the substrate; and locally heating the soldering glass with a light source having a predetermined peak wavelength.

2. An encapsulated semiconductor component produced by the process of claim 1.

3. The process as claimed in claim 1, wherein the provided soldering glass is also applied to the substrate.

4. An encapsulated semiconductor component produced by the process of claim 3.

5. The process as claimed in claim 1, wherein the light source is a laser which absorbs in the near IR at 780 to 1100 nm.

6. An encapsulated semiconductor component produced by the process of claim 5.

7. The process as claimed in claim 1, further comprising at least one of preheating and reheating the soldering glass with the light source.

8. An encapsulated semiconductor component produced by the process of claim 7.

9. The process as claimed in claim 1, wherein the at least one further housing part comprises separate side walls.

10. An encapsulated semiconductor component produced by the process of claim 9.

11. The process as claimed in claim 1, wherein the the provided soldering glass is mixed with a binder or solvent.

12. The process as claimed in claim 11, wherein the the binder or solvent is expelled after the soldering glass is applied.

13. The process as claimed in claim 11, wherein an agent which absorbs at least the peak wavelength of the light source, is additionally admixed to the provided soldering glass.

14. An encapsulated semiconductor component produced by the process of claim 13.

15. The process as claimed in claim 13, wherein the agent is iron oxide.

* * * * *